(12) United States Patent
Suzuki

(10) Patent No.: US 8,876,336 B2
(45) Date of Patent: Nov. 4, 2014

(54) LED LAMP UNIT

(75) Inventor: Yasuo Suzuki, Makinohara (JP)

(73) Assignee: Yazaki Corporation, Tokyo (JP)

( * ) Notice: Subject to any disclaimer, the term of this patent is extended or adjusted under 35 U.S.C. 154(b) by 172 days.

(21) Appl. No.: 13/574,639

(22) PCT Filed: Jan. 24, 2011

(86) PCT No.: PCT/JP2011/051224
§ 371 (c)(1),
(2), (4) Date: Jul. 23, 2012

(87) PCT Pub. No.: WO2011/090196
PCT Pub. Date: Jul. 28, 2011

(65) Prior Publication Data
US 2012/0294012 A1    Nov. 22, 2012

(30) Foreign Application Priority Data
Jan. 25, 2010   (JP) .................. 2010-012895

(51) Int. Cl.
*F21V 19/00*  (2006.01)
*H01L 33/48*  (2010.01)
*F21Y 101/02* (2006.01)

(52) U.S. Cl.
CPC .......... *F21V 19/0015* (2013.01); *H01L 33/483* (2013.01); *F21Y 2101/02* (2013.01); *F21V 19/0025* (2013.01)
USPC ...... 362/311.02; 362/652; 362/655; 362/656; 362/396

(58) Field of Classification Search
CPC ............ F21V 19/0025; F21V 19/0015; F21V 19/0035; F21V 19/004; F21V 19/0045; F21V 19/042; F21V 19/045; F21V 17/162
USPC ........... 362/311.02, 548, 549, 652, 655, 656, 362/657, 646, 455, 658, 659
See application file for complete search history.

(56) References Cited

U.S. PATENT DOCUMENTS 6,447,170 B1 *  9/2002  Takahashi et al. .............. 385/53
7,380,961 B2 *  6/2008  Moriyama et al. ............ 362/238

(Continued)

FOREIGN PATENT DOCUMENTS

| JP | 2004172032 A | 6/2004 |
| JP | 200544777 A | 2/2005 |
| JP | 2006261048 A | 9/2006 |
| JP | 2007194172 A | 8/2007 |
| JP | 2008071968 A | 3/2008 |

OTHER PUBLICATIONS

International Search Report dated Apr. 26, 2011 issued by the International Searching Authority in counterpart International Application No. PCT/JP2011/051224.

(Continued)

*Primary Examiner* — Jong-Suk (James) Lee
*Assistant Examiner* — James Endo
(74) *Attorney, Agent, or Firm* — Sughrue Mion, PLLC

(57) ABSTRACT

In LED lamp unit, a flat LED body has a light emitting part at a front surface side, and a pair of terminal parts at a rear surface side. Each of a pair of busbars includes a busbar body which is provided with a lock piece which locks the LED body and a contact spring piece which contacts the terminal part. A lock part provided at a free end side of the contact spring piece is inserted through a hole in the busbar body. A lens member accommodates an LED connection body in which the LED body is assembled to the pair of busbars. The LED connection body includes locked parts engaged with the lock parts, and an inner wall surface to which the lock part is press-contacted in a direction opposite to the terminal part in a state where the locked parts are engaged with the lock parts.

4 Claims, 7 Drawing Sheets

(56) References Cited

U.S. PATENT DOCUMENTS 7,441,933 B2 * 10/2008 Tsukamoto et al. .......... 362/548
2005/0007783 A1    1/2005 Ono
2007/0035965 A1 *  2/2007 Holst ............................ 362/608
2007/0171662 A1    7/2007 Tokida

OTHER PUBLICATIONS

Written Opinion dated Apr. 26, 2011 issued by the International Searching Authority in counterpart International Application No. PCT/JP2011/051224.

* cited by examiner (a)  (b)

(a)  (b)

(a)  (b)

LED LAMP UNIT

CROSS REFERENCE TO RELATED APPLICATIONS

This application is a national stage application under 35 U.S.C. §371 of International Application No. PCT/JP2011/051224, filed Jan. 24, 2011, and claims benefit to Japanese Patent Application No. 2010-012895, filed on Jan. 25, 2010. The contents of PCT/JP2011/051224 are incorporated herein by reference in its entirety.

TECHNICAL FIELD

The invention is related to an LED lamp unit which includes an LED body, busbars and a lens member, and can be mounted in, for example, an interior of a vehicle.

BACKGROUND ART

FIG. 16 shows a conventional LED lamp unit (refer to a PTL 1).

In an LED lamp unit 61, a chip type LED 64, which includes an LED element, a flat lens 62 which covers the LED element and a case 63, is accommodated in a socket 65, and a socket cover 66 is closed. With this structure, LED terminals (not shown in the drawing) inside the case 63 can be made to elastically contact with terminals 67 which are projected obliquely upwards in the socket 65. The terminals 67 are press-contacted to electric wires 68. The LED is a light emitting diode.

A LED lamp unit (not shown in the drawings) other than the above is disclosed in a PTL 2 which makes a pair of terminals of an LED, which includes a light emitting part, a body part, and the pair of terminals, to be engaged with and connected to fitting parts, which have an L-shaped cross section, of power supplying parts on a molded board by being slid.

CITATION LIST

Patent Literatures

[PTL 1] JP-A-2008-71968 (FIG. 1)
[PTL 2] JP-A-2004-172032 (FIG. 1)

SUMMARY OF THE INVENTION

Technical Problem

However, there are the following concerns in the above-mentioned conventional LED lamp unit 61. The contact pressure of the terminals 67 and the chip type LED (LED body) 64 varies or may fall. After the chip type LED 64 is accommodated in the socket, the socket cover 66 has to be closed, and thus the assembling operation is troublesome. Since the flat lens 62 is provided in the chip type LED 64, it is hard to respond to the change of the shape of the lens 62. Since the flat lens 62 has a flat shape, light cannot be diffused, and it is impossible to respond to multiple applications.

In view of the above-mentioned points, the invention is intended to provide an LED lamp unit which can make an LED body and terminals (busbars) to be definitely electrically contacted with a high contact pressure, make the assembly operation easy, make the shape change of the lens easy, and make it possible to respond to multiple applications.

Solution to Problem

In order to solve the above problem, according to a first invention, there is provided an LED lamp unit comprising:

a flat LED body which has a light emitting part at a front surface side thereof, and a pair of terminal parts at a rear surface side thereof, respectively;

a pair of busbars, each of which includes a busbar body which is provided with a lock piece which locks the LED body and a contact spring piece which contacts with the terminal part, wherein a lock part provided at a free end side of the contact spring piece is inserted through a hole formed in the busbar body; and a lens member, which accommodates an LED connection body in which the LED body is assembled to the pair of busbars, and which includes locked parts engaged with the lock parts, and an inner wall surface to which the lock part is configured to be press-contacted in a direction opposite to the terminal part in a state where the locked parts are engaged with the lock parts.

With the above structure, the LED body is locked by the lock pieces of the pair of busbars, and at the same time the free ends (lock parts) of the contact spring pieces are passed through the holes of the busbar bodies, and projected to the side opposite to the terminal parts of the LED body. By inserting the LED connection body in this state into the lens body, the lock parts are engaged with and locked to the locked parts, and at the same time the lock parts elastically contact (contact by pressure) the inner wall surface of the lens body, the contact spring pieces are strongly pressed against the terminal parts of the LED body due to the counter force of the inner wall surface, and the electrical contact is definitely ensured.

According to a second invention, in the LED lamp unit according to the first invention, a dome-shaped lens body is integrally provided in the lens member and so as to oppose the light emitting part.

With the above structure, it is not necessary to provide the lens body in the LED body, and the LED body can be commonly used in multiple applications. The number of components is reduced due to the lens member integrated with the lens body. The light from the light emitting part is diffused in multiple directions with the dome-shaped lens body.

According to a third invention, in the LED lamp unit according to the first or second inventions, guide grooves which guide the busbar bodies and the contact spring pieces are provided in the lens member.

With the above structure, after the LED body is assembled, the busbar bodies and the contact spring pieces of the pair of busbars are smoothly inserted and accommodated in the lens member along the guide grooves of the lens member. In this case, the lock parts of the contact spring pieces contact and slide on the bottom surfaces of the guide grooves, or the inner wall surface, and are locked with the locked parts on the inner wall surface.

According to a fourth invention, in the LED lamp unit according to any one of the first to third inventions, the lens member has a box shape which has an opening through which the LED connection body is inserted, an accommodating space, and walls which surround the accommodating space.

With the above structure, the LED connection body is inserted and accommodated in the accommodating space from the opening of the lens member in one direction and with good workability. The walls that surround the accommodating space form the housing, and the lens body is formed integrally with one wall.

Advantageous Effects of Invention

According to the first invention, when the LED body is temporarily fixed (locked) to the pair of busbars (the LED connection body is formed), the LED connection body is accommodated and locked in the lens body. Therefore, the assembly of the LED lamp unit can be performed definitely with quite simple operations. Further, while the LED connection body is accommodated in the lens body, the lock parts contact the inner wall surface and the contact spring pieces are strongly pressed against the terminal parts of the LED body. Therefore, the reliability of the electrical connection of the LED body and the busbars can be improved.

According to the second invention, since the lens body is integrally provided in the lens member which accommodates the LED body, the component number of the LED lamp unit can be reduced and the cost can be lowered.

According to the third invention, the busbars of the LED connection body can be smoothly inserted along the guide grooves, and can be correctly positioned in the lens member. Therefore, the light emitting part of the LED body and the lens body of the lens member can be positioned correctly, and light can be well diffused.

According to the fourth invention, the LED lamp unit can be completed simply and definitely by an operation of inserting the LED connection body into the lens member only in one direction. The small, flat LED lamp unit can be obtained by accommodating the flat LED body in the box-like lens member.

BRIEF DESCRIPTION OF DRAWINGS

FIG. 4 is a drawing which shows that the LED body is being assembled to the busbars, in which FIG. 4(a) is a side view thereof, and FIG. 4(b) is an enlarged drawing of main parts in the frame of FIG. 4(a).

FIG. 5 is a drawing which shows that the LED body is assembled to the busbars (LED connection body), in which FIG. 5(a) is a side view thereof, and FIG. 5(b) is an enlarged drawing of main parts in the frame of FIG. 4(a).

FIG. 7 is a drawing which shows one embodiment of a lens member which is another component, in which FIG. 7(a) is a front view, FIG. 7(b) is an A-A sectional view (enlarged perspective view of main parts in the frame) of FIG. 7(a), and FIG. 7(c) is a perspective view from the back side.

FIG. 8 is a perspective view which shows one embodiment of a counterpart which the LED lamp unit is attached to.

FIG. 11 is a drawing which shows that the LED connection body is being assembled into the lens member, in which FIG. 11(a) is a longitudinal section view thereof, and FIG. 11(b) is an enlarged drawing of main parts in the frame of FIG. 11(a).

FIG. 12 is a drawing which shows that the LED connection body is being assembled into the lens member, in which FIG. 12(a) is a longitudinal section view thereof, and FIG. 12(b) is an enlarged drawing of main parts in the frame of FIG. 11(a).

FIG. 13 is a drawing which shows that the LED connection body is assembled into the lens member, in which FIG. 13(a) is a longitudinal section view thereof, and FIG. 13(b) is an enlarged drawing of main parts in the frame of FIG. 11(a).

FIG. 14 is a drawing which similarly shows the LED lamp unit in an assembled state, in which FIG. 14(a) is a B-B sectional view of FIG. 9, and FIG. 14(b) is an enlarged drawing of main parts in the frame of FIG. 14(a).

DESCRIPTION OF EMBODIMENTS

Figure 1:
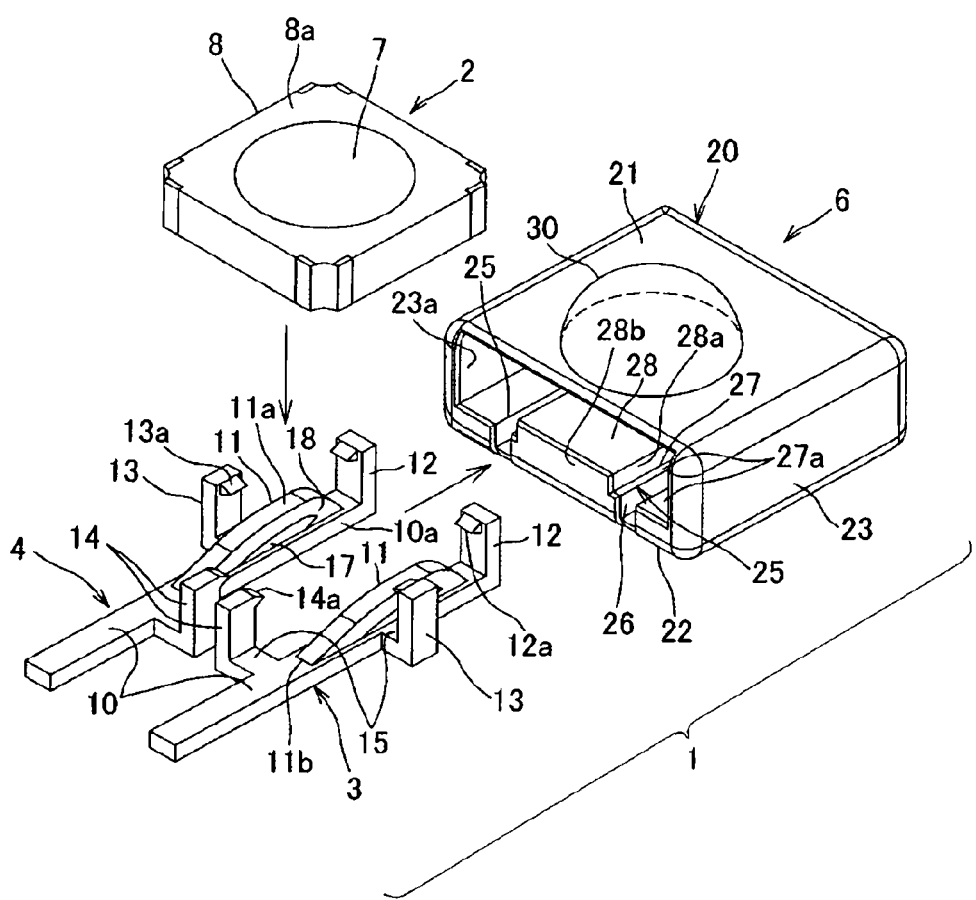
FIG. 1 is an exploded perspective view which shows one embodiment of an LED lamp unit according to the invention.

FIG. 1 is a drawing which shows one embodiment of an LED lamp unit according to the invention.

The LED lamp unit 1 includes a rectangular board-like flat LED body 2, a pair of busbars 3 and 4 made of conductive metal which connect and lock the LED body 2, and a rectangular case-like lens member (housing with a lens) 6 made of synthetic resin which an LED connection body 5 (FIG. 6), which includes the LED body 2 and the pair of busbars 3 and 4, is inserted into and is locked with.

Figure 2:
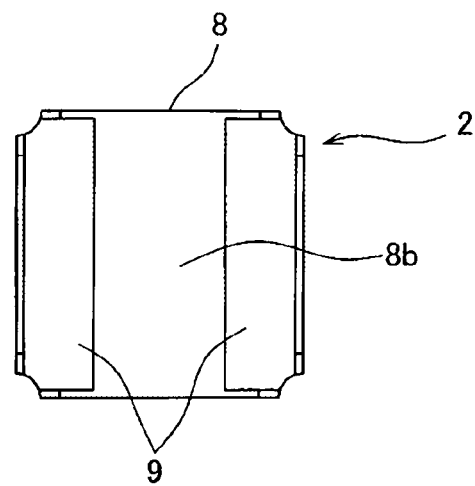
FIG. 2 is a plan view which shows the bottom of one embodiment of a LED body which is a component of the LED lamp unit.

The LED body 2 includes a central light emitting part 7 which is round in a plan view, a square insulative resin part 8 which covers the parts around the light emitting part 7, and a pair of right and left metal terminal parts (conductive parts) 9 which are provided on the rear surface of the insulative resin part 8 as shown in FIG. 2 and are connected to the light emitting part 7. The upper surface (light emitting surface) of the light emitting part 7 is located on the same level as the upper surface 8a of the insulative resin part 8. The lower surfaces (conductive surfaces) of the pair of terminal parts 9 (FIG. 2) are preferred to be located on the same level as the lower surface (rear surface) 8b of the insulative resin part 8.

Figure 3:
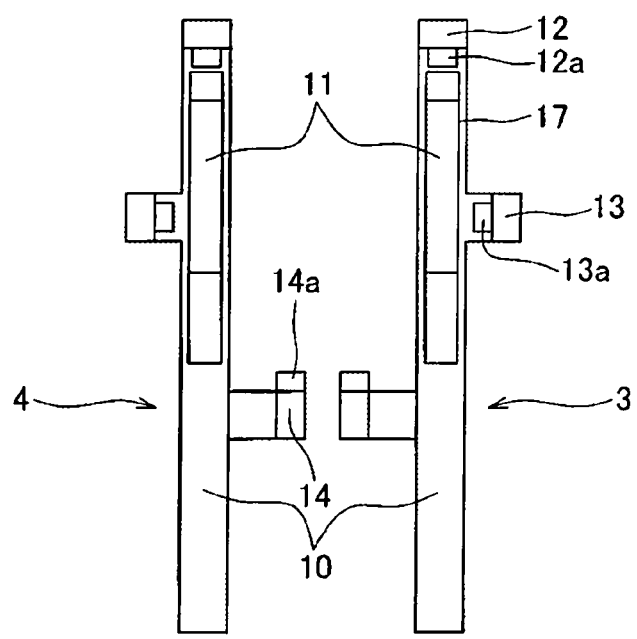
FIG. 3 is a plan view which shows one embodiment of busbars which are other components of the LED lamp unit.
Figure 4:
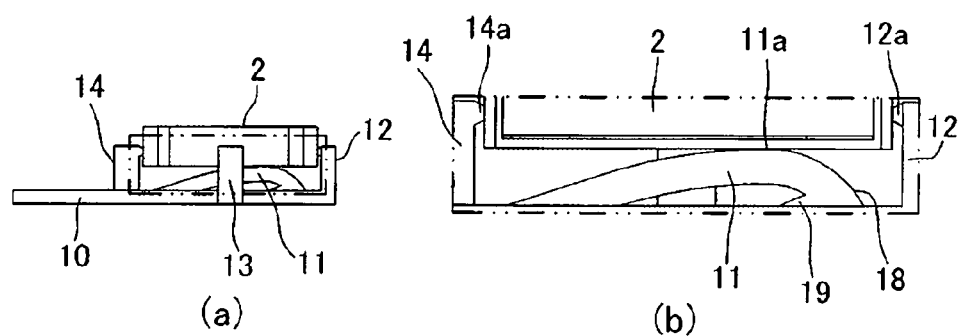

As shown in FIGS. 1 and 3, the pair of busbars 3 and 4 are separated and arranged right-left symmetrically, and each of the busbars 3 and 4 includes a board-like busbar body 10, a curved contact spring piece 11 which is formed by being cut and raised upwards at the front half of the busbar body 10, an elastic lock piece 12 which is formed by being raised at the front end of the busbar body 10, and flexible lock pieces 13 and 14 which are formed by being raised via extended pieces 15 at the middle part of the outer side surface and the rear half part of the inner side surface of the busbar body 10, respectively.

The lock piece 12 at the front end has a backwards claw 12a, and is located in front of the contact spring piece 11. The outer lock piece 13 has an inwards claw 13a, and is located opposite to the middle part of the contact spring piece 11 in the longitudinal direction. The inner lock piece 14 has a forwards claw 14a, and is located behind the contact spring piece 11. Each of the claws 12a to 14a is located to be slightly higher than the contact spring piece 11.

Figure 5:
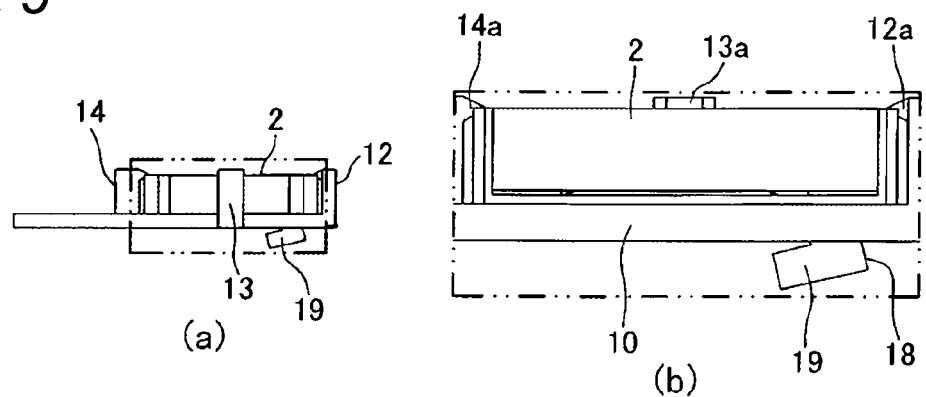

As shown in FIG. 1, the lock pieces 12 to 14 in a free state are projected to be curved upwards from the upper surface of the busbar body 10. The distal end (front end or free end) 18 of the contact spring piece 11 is located inside a slit-like punched hole 17 of the busbar body 10. The base end (back end) 11b of the contact spring piece 11 intersects and integrally connects with the busbar body 10. The distal end 18 of the contact spring piece 11 is bended backwards to a hook shape as shown in FIG. 5, and becomes a lock projection (lock part) 19 opposite to the lens member 6. The top part of the contact spring piece 11 becomes a contact part 11a opposite to the terminal part 9 of the LED body 2 of FIG. 2.

Figure 6:
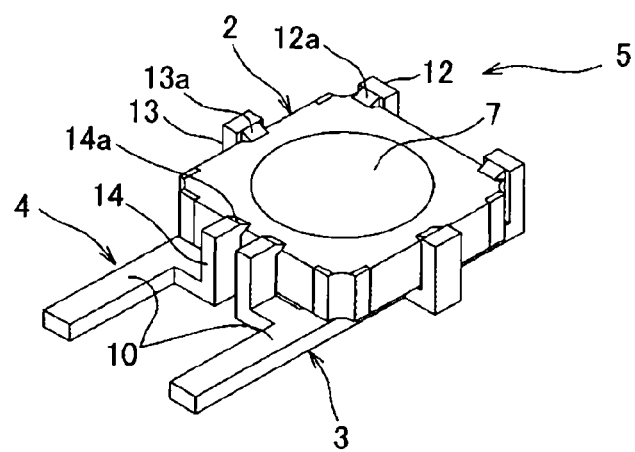
FIG. 6 is a perspective view which shows that the LED body is assembled to the busbars.

When the pair of busbars 3 and 4 are arranged to be right-left symmetrical (in parallel), the LED body 2 is inserted in a thickness direction from above to the inside the lock pieces 12 to 14 of the busbars 3 and 4 (the lock pieces 12 to 14 are flexed outward, and are restored after the insertion). The contact spring pieces 11 are pushed and bended downwards by the LED body 2, and as shown in FIGS. 5(a), 5(b) and 6, the upper end of the LED body 2 is locked by the claws 12a to 14a of the lock pieces 12 to 14. Simultaneously, as shown in FIGS. 5(a) and 5(b), the distal ends 18 and the lock parts 19 of the contact spring pieces 11 are inserted through the hole 17, and projected downwards from the lower surface of the busbar bodies 10. The top parts 11a of the contact spring pieces 11 urge the LED body 2 upwards with the spring forces (spring restoration forces), and the LED body 2 is temporarily fixed among the claws 12a to 14a. Therefore, as shown in FIG. 6, the pair of busbars 3 and 4 will not be separated from the LED body towards sides, and thus the LED connection body 5 is formed. The lock pieces 12 to 14 hold the LED body 2 so that the front, the rear, the right and the left of the LED body 2 are surrounded, and the LED body 2 is prevented from being displaced.

As shown in FIG. 1, the lens member 6 includes a rectangular box-shaped housing 20, and a transparent dome-shaped part (lens body) 30 which is provided integrally with the upper wall 21 of the housing 20. A pair of right and left guide grooves 25 into which the busbars are inserted are provided on the inner surface of the lower wall (bottom wall) 22 of the housing 20.

Each of the guide grooves 25 includes a bottom-half narrow slot 26 in which the lock projection 19 at the distal end side of the contact spring piece 11 is accommodated, and a top-half broad slot 27 which guides the busbar body 10 and the outer lock piece 13. The broad slots 27 are formed between the side surfaces 28a of a central convex wall part 28 of the housing lower wall 22 and the inner surfaces 23a of the right and left side walls 23 of the housing 20. The bottom surfaces of the busbar bodies 10 touch the bottom surfaces 27a of the broad slots 27, and the inner side surfaces 10a of the busbar bodies 10 touch the side surfaces 28a of the convex wall part 28. The outer (middle) lock pieces 13 touch the inner surfaces 23a of the right and left side walls 23 of the housing 20, and the inner (backside) lock pieces 14 touch the back end 28b of the central convex wall part 28.

Figure 7:
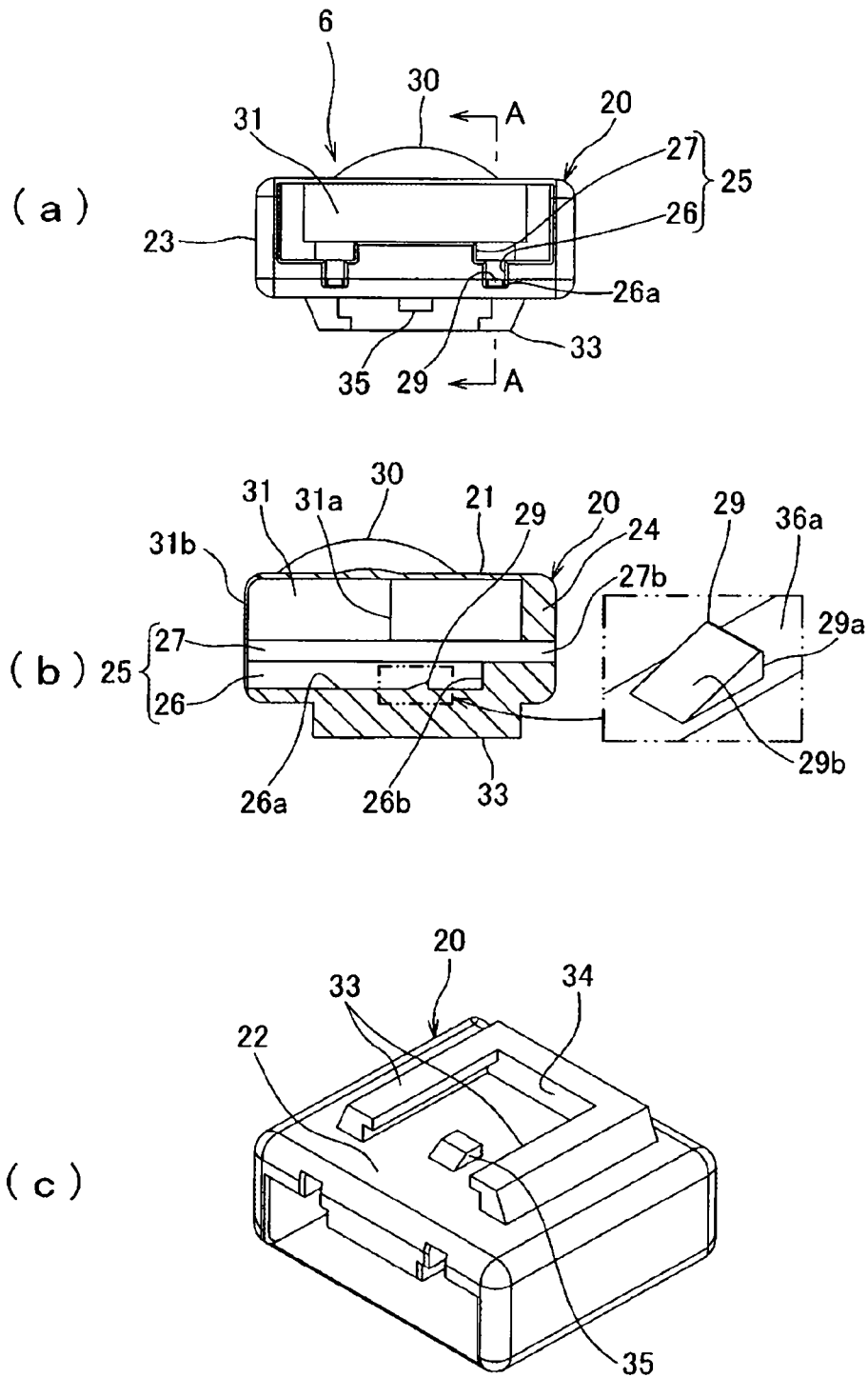

As shown in FIG. 7(b), a locked projection (locked part) 29 opposes the lock projection 19 at the front end side of the contact spring piece 11 is provided on the bottom surface (inner wall surface) 26a of the narrow slot 26. The locked projection 29 has a vertical lock surface 29a at the front side, and a guide slope surface 29b at the back side so that the longitudinal section of the locked projection 29 is a triangle. The narrow slot 26 is terminated before the front wall 24 of the housing 20, and the distal end 18 of the contact spring piece 11 approaches the end surface 26b. The broad slot 27 is passed through the front wall 24, and becomes a hole 27b into which a jig rod which unlocks the contact spring piece 11 is inserted. The lock piece 12 (FIG. 1) at the front end which is higher than the hole 27b is projected and contacts with the inner surface of the front wall 24. In the description, the directions of up, down, front, rear, right and left are used to facilitate the explanation.

A rectangular space (accommodating space) 31 in which the LED body 2 (FIG. 1) is accommodated is formed above the guide grooves 25. The space 31 is next to the dome-shaped lens body 30 via the transparent upper wall 21 at the thin part of the housing 20. Steps 31a which contact the outer lock pieces 13 (FIG. 1) are formed in the middle of the right and left side walls 23 of the housing 20. The lens body 30 is solid inside.

Figure 8:
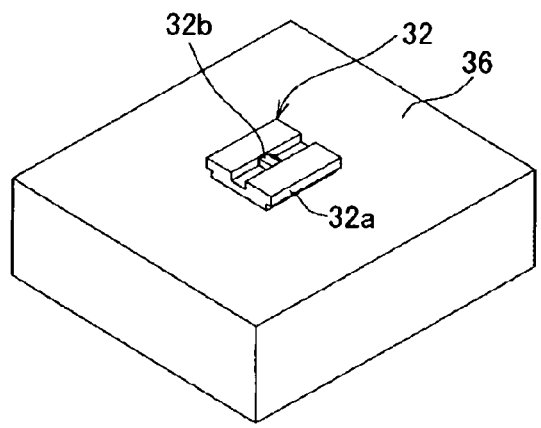

As shown in FIGS. 7(a) and 7(c), a pair of right and left rail parts 33 whose section is an inwards L shape and which are opposite to a through bracket (lock part) 32 at the side of the vehicle body of FIG. 8, a contact wall 34 which links the front ends of the rail parts 33, and a lock projection 35 which is disposed in the middle of the pair of rail parts 33 are provided on the outer surface of the bottom wall 22 of the housing 20. The lock part 32 of FIG. 8 is, for example, provided downwards (in FIG. 8, shown as upward) in a fitting part 36 such as a ceiling panel made of synthetic resin of a vehicle, and includes a pair of right and left outwards rail parts 32a and a central engaging projection 32b. The LED lamp unit 1 (FIG. 9) of this example is suitable for an in-vehicle indoor map lamp.

Figure 9:
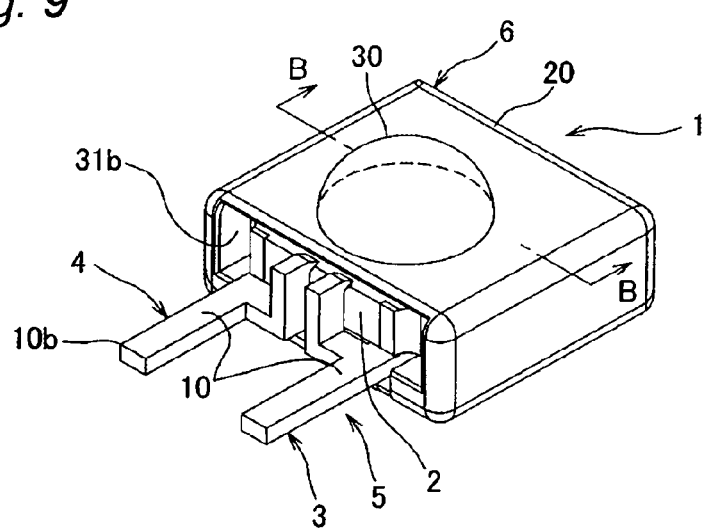
FIG. 9 is a perspective view which shows the LED lamp unit when the LED connection body is assembled in the lens member.

As shown in FIG. 9, the LED connection body 5 of FIG. 6 which is an assembly of the busbars 3 and 4 and the LED body 2 is inserted into the accommodating space 31 from a rear opening 31b of the lens member 6, and straight latter half parts 10b of the busbar bodies 10 are projected outwards from the rear opening 31b horizontally. Electric wires (not shown in the drawings) are respectively connected to the latter half parts 10b of the busbar bodies 10 by welding, pressure welding, crimping or other means. In the case of pressure welding or crimping, a pair of pressure welding pieces or crimping pieces (not shown in the drawings) are formed by being raised at the latter half parts 10b or their extensions (not shown in the drawings).

Below, processes in which the LED connection body 5 is inserted into the lens member 6 are explained by using FIGS. 10 to 13(a) and 13(b). FIGS. 10 to 13(a) and 13(b) are drawings of the same cross section as FIG. 7(b).

Figure 10:
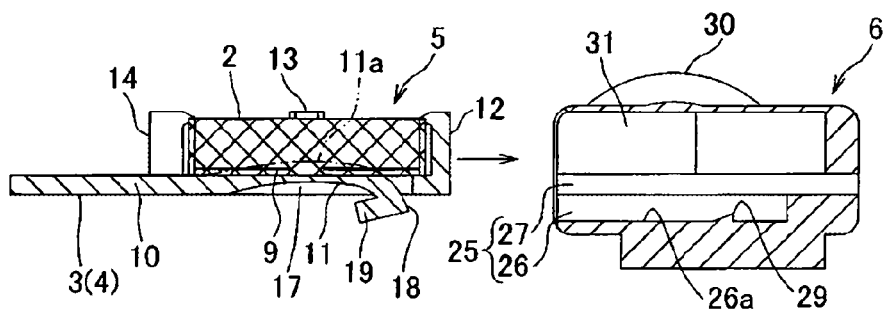
FIG. 10 is a longitudinal section view (A-A equivalent sectional view of FIG. 7 (a)) which shows that the LED connection body is assembled into the lens member.
Figure 11:
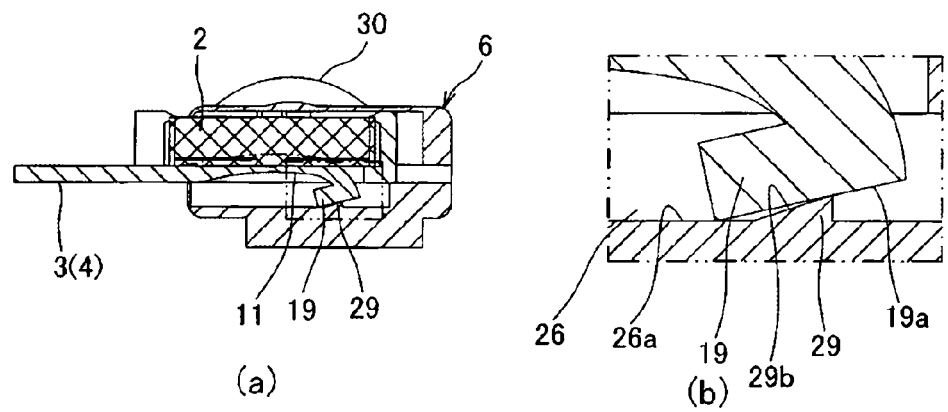
Figure 12:
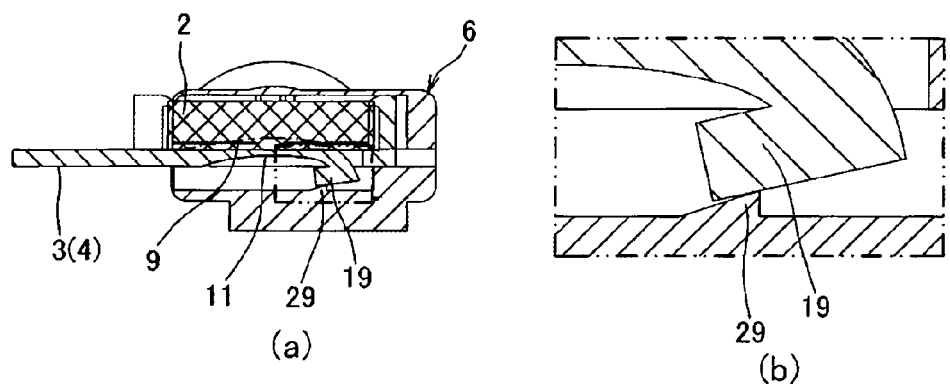
Figure 13:
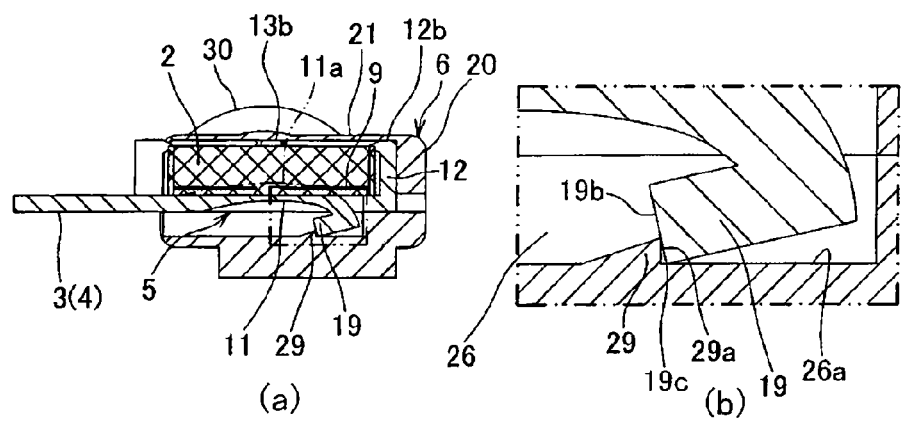

As shown in FIG. 10, before the LED connection body 5 is inserted into the lens member 6, the contact spring pieces 11 of the busbars 3 and 4 curve and elastically contact with the terminal parts 9 on the bottom surface of the LED body 2 (in the drawings, the contact spring pieces 11 are shown in a state where the LED body 2 is not installed, and a vertical distance from the top parts 11a shown as a chain line to the terminal parts 9 on the bottom surface of the LED body 2 performs as a contact range). The distal end 18 and the lock projection 19 of the contact spring piece 11 are passed through the hole 17 of the busbar body 10, and are projected downwards. The LED connection body 5 of FIG. 10 is in the state of FIG. 5.

By inserting the LED connection body 5 into the space 31 of the lens member 6 along the arrow direction, as shown in FIGS. 11(a) and 11(b), the inclined lower surface 19a of the backwards bended hook-shaped lock projection 19 at the front end side of the contact spring piece 11 is slid along the inclined guide upper surface 29b of the locked projection 29 in the guide groove 25. At the same time, as shown in FIGS. 12(a) and 12(b), the contact spring piece 11 is flexed upwards to be flat. As shown in FIGS. 13(a) and 13(b), when the lock projection 19 climbs over the locked projection 29, the contact spring piece 11 is elastically restored downward, and the rear end surface (lock surface) 19b of the lock projection 19 contacts the lock surface 29a at the front end of the locked projection 29. Thus, the busbars 3 and 4, in other words, the LED connection body 5 is prevented from being pulling backwards.

Simultaneously, the lower end 19c of the lock projection 19 of the contact spring piece 11 is elastically pressed against (bottomed on) the bottom surface (inner wall surface) 26a of the barrow groove 26, and the contact surface (contact point) of the top part 11a of the contact spring piece 11 strongly contacts the terminal part 9 on the bottom surface of the LED body 2 due to a counter force from the bottom surface. Therefore, the electrical connection of the busbars 3 and 4 and the LED body 2 is definitely performed with a strong contact pressure, loose contact or the like are prevented, and the reliability of the electrical connection is improved.

The upper surfaces 12b and 13b of the lock pieces 12 and 13 in the front of and in the middle of the busbars 3 and 4 contact the inner surface of the upper wall 21 of the housing 20. Since the LED body 2 is prevented by the claws 12a to 14a of the lock pieces 12 to 14 from being moved upwards, the elastic forces of the contact spring pieces 11 which are bottomed on the bottom surface 26a are definitely conveyed to the terminal parts 9 of the LED body 2. The upper surface of the LED body 2, that is, the upper surface of the light emitting part 7 (FIG. 1), is located so that there are some gaps between the upper surface of the light emitting part 7 and the inner surface of the upper wall 21 of the housing 20. The lens body 30 is located near the top of the light emitting part 7 and opposite to the light emitting part 7. The center of the light emitting part 7 and the center of the lens body 30 are correctly aligned when the busbars 3 and 4 are positioned by the guide grooves 25.

As shown in FIGS. 14(a) and 14(b) (B-B sectional view of FIG. 9), the top parts 11a of the contact spring pieces 11 of the pair of right and left busbars 3 and 4 definitely contact the terminal parts 9 on the bottom surface of the LED body 2 in a big contact range, as shown by the chain line which indicates the free state where the LED body 2 is not installed, since the contact spring pieces 11 are bottomed on the bottom surfaces of the guide grooves 26. In FIGS. 14(a) and 14(b), the symbol 10 shows the busbar body, the symbol 15 shows the jointing piece of the outer lock piece 13, and the narrow slot 26 and the broad slot 27 show the guide grooves 25, respectively. The lens body 30 has a lower surface 30a which is on the same level as the inner surface of the upper wall 21 of the housing 20, and the upper surface (irradiation surface) 30b of the lens body 30 is formed to have an arc-shaped cross section.

FIGS. 15(a) to 15(c) show various shape examples of the lens body 30. Since the lens body 30 is integrated with the housing 20, by commonly using the LED body 2 or the busbars 3 and 4, but only exchanging the lens members 6 with the lens body 20 of the same shape, the irradiation angle to the outside of the light from the light emitting part 7 (FIG. 1) of the LED body 2 can be suitably set with various shapes of lens body 30, and it is possible to be correspondingly assembled to vehicles whose irradiation areas are different. When the lens body 30 is not formed (when there is only the upper wall 21 of the housing 20), light is irradiated only upwards in a rectilinear direction, but by using the dome-shaped lens body 30, the light is diffused and the radiation area can be expanded.

Figure 14:
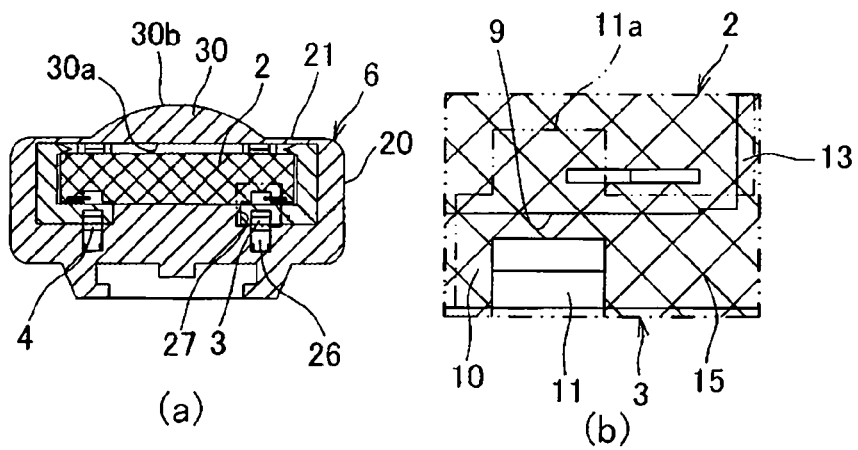
Figure 15:
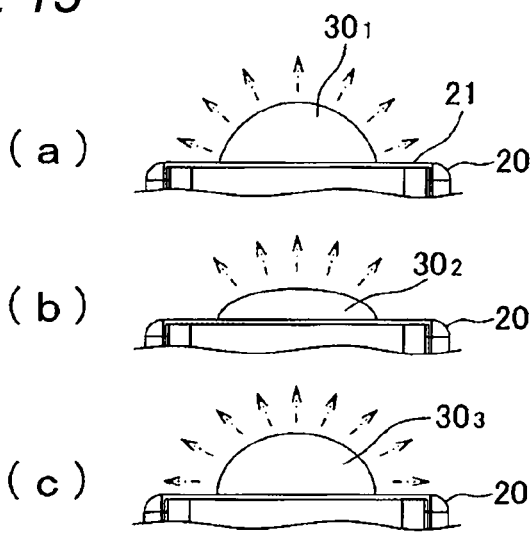
FIGS. 15(a) to 15(c) are side views which show various examples of the lens body of the lens member.
Figure 16:
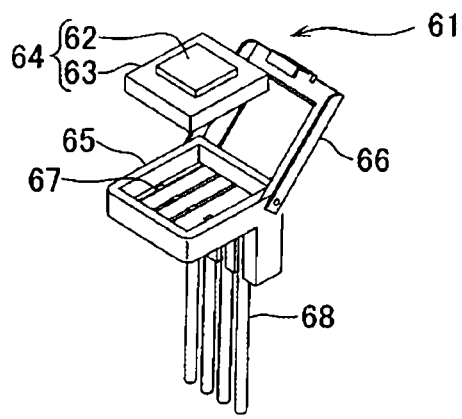
FIG. 16 is an exploded perspective view which shows one embodiment of a conventional LED lamp unit.

FIG. 15 (a) is an example in which a lens body $30_1$ which has a semicircular cross section is formed, and the light from the LED body 2 is irradiated in a range (multiple directions) wider than that of the lens body 30 of FIG. 14 which has an arc-shaped cross section. FIG. 15 (b) is an example in which a lens body $30_2$ of a half-elliptic shape is formed in which the arc shape is brought close to a flat shape, and the diffusion of light is suppressed in a comparatively narrow range. FIG. 15 (c) is an example in which a lens body $30_3$ of a shape which combines the semicircular shape and the half-elliptic shape is formed, and light is diffused in a wide range.

The contact spring piece 11 is cut and raised in the center of the busbar body 10 in the width direction and the distal end 18 of the contact spring piece 11 can enter into the central hole 17 in the width direction in the above-mentioned embodiment. However, for example, when the width of the busbar body 10 is wide, it is possible that the contact spring piece 11 is cut and raised at one side but not in the center, and the distal end 18 of the contact spring piece 11 is made to enter into a hole (17) of a notch shape whose one side is open. Although the lock projection 19 of the contact spring piece 11 is formed by being bended backward, it is also possible to bend not backwards but downwards (in the direction of 90 degree) to form a lock projection (19) (in this case, it is preferred to provide an inclined surface (19a) for the sliding opposite to the locked projection 29 at the front end of the lock projection 19).

The shape of the contact spring piece 11 is not limited to the crooked shape, but may be bended to a reverse V shape. The lock pieces 12 to 14 are not limited to be at the upper end of the LED body 2, but may make the claws 12a to 14a to be engaged with recesses (not shown in the drawings) at the middle part of the LED body 2 in the thickness (height) direction (in this case, it is preferred to provide ribs or the like which the upper surface of the LED body 2 contacts on the inner surface of the upper wall of the housing 20).

The LED lamp unit according to this invention can be used in order to make the assembling operation easier or the electric contact more reliable in an indoor map lamp of a vehicle, for example.

Although the present invention is described in detail with reference to specific embodiments, it is apparent that various modifications and amendments may be made by those skilled in the art without departing from the spirit and scope of the invention.

Reference Signs List
1 LED lamp unit
2 LED body
3 and 4 busbar
5 LED connection body
6 lens member
7 light emitting part
9 terminal part
10 busbar body
11 contact spring piece
12 to 14 lock piece
17 hole
19 lock projection (lock part)
21 to 24 wall
25 (26, 27) guide groove
26a bottom surface (inner wall surface)
29 locked projection (locked part)
30 lens body
31 space (accommodating space)
31b opening

The invention claimed is:

1. An LED lamp unit comprising:
a flat LED body which has a light emitting part at a front surface side thereof, and a pair of terminal parts at a rear surface side thereof, respectively;
a pair of busbars, each of which includes a busbar body which is provided with a lock piece which locks the LED body and a contact spring piece which contacts with the terminal part, wherein a spring piece lock part provided at a free end side of the contact spring piece is inserted through a hole formed in the busbar body; and
a lens member, which accommodates an LED connection body in which the LED body is assembled to the pair of busbars, the lens member including lens member locked parts engaged with the spring piece lock parts, and an inner wall surface where the spring piece lock part of each of the busbars is press-contacted in a direction substantially perpendicular to the terminal part in a state where the lens member locked parts are engaged with the spring piece lock parts.

2. The LED lamp unit according to claim 1, wherein a dome-shaped lens body is integrally provided in the lens member and so as to oppose the light emitting part.

3. The LED lamp unit according to claim 1, wherein guide grooves which guide the busbar bodies and the contact spring pieces are provided in the lens member.

4. The LED lamp unit according to claim 1, wherein the lens member has a box shape which has an opening through which the LED connection body is inserted, an accommodating space, and walls which surround the accommodating space.

* * * * *